United States Patent
Zurecki et al.

(10) Patent No.: US 8,268,094 B2
(45) Date of Patent: Sep. 18, 2012

(54) FURNACE ATMOSPHERE ACTIVATION METHOD AND APPARATUS

(75) Inventors: Zbigniew Zurecki, Macungie, PA (US); Robert Ellsworth Knorr, Jr., Allentown, PA (US); John Lewis Green, Palmerton, PA (US)

(73) Assignee: Air Products and Chemicals, Inc., Allentown, PA (US)

(*) Notice: Subject to any disclaimer, the term of this patent is extended or adjusted under 35 U.S.C. 154(b) by 789 days.

(21) Appl. No.: 12/113,565

(22) Filed: May 1, 2008

(65) Prior Publication Data
US 2008/0283153 A1    Nov. 20, 2008

Related U.S. Application Data

(60) Provisional application No. 60/928,385, filed on May 9, 2007.

(51) Int. Cl.
| | |
|---|---|
| C23C 8/68 | (2006.01) |
| B01J 19/08 | (2006.01) |
| C23C 8/20 | (2006.01) |
| C23C 8/24 | (2006.01) |
| C23C 8/30 | (2006.01) |
| C23C 8/36 | (2006.01) |

(52) U.S. Cl. ........ 148/217; 148/218; 148/222; 204/164; 422/186.04

(58) Field of Classification Search ................ 148/222, 148/217–218; 204/164; 422/186.04
See application file for complete search history.

(56) References Cited

U.S. PATENT DOCUMENTS

| | | | |
|---|---|---|---|
| 4,265,720 A * | 5/1981 | Winstel | 205/637 |
| 4,887,005 A * | 12/1989 | Rough et al. | 315/111.21 |
| 5,059,757 A | 10/1991 | Law | |
| 5,104,634 A * | 4/1992 | Calcote | 423/446 |
| 5,281,790 A | 1/1994 | Nguyen | |
| 5,605,580 A | 2/1997 | Orita | |
| 5,680,014 A | 10/1997 | Miyamoto et al. | |
| 5,693,241 A | 12/1997 | Banks et al. | |
| 5,717,186 A | 2/1998 | Drissen | |
| 5,821,492 A | 10/1998 | Shepard et al. | |
| 5,989,363 A | 11/1999 | Georges | |
| 6,007,742 A | 12/1999 | Czernichowski | |
| 6,121,572 A | 9/2000 | Holste et al. | |

(Continued)

FOREIGN PATENT DOCUMENTS

CN    1700953 A    7/2007

(Continued)

OTHER PUBLICATIONS

A. Scarpa et al., "Combustion of methane-hydrogen mixtures on catalytic tablets", Chemical Engineering Journal 154 (2009) 315-324.*

(Continued)

*Primary Examiner* — Jessee R. Roe
(74) *Attorney, Agent, or Firm* — Anne B. Kiernan (57) ABSTRACT

A gas injector including in which a gas is passed through high-voltage/low-current electrical discharges before being discharged into the chamber of a thermal treatment furnace. The electrical activation of the gas accelerates desirable reactions between the gas, gases in the furnace chamber, and the chamber workload. Preferably, a hot electrode is electrically charged and the other parts of the gas injector and the furnace are grounded. Also provided is a method for activating an atmosphere within the reaction chamber of a controlled-atmosphere reactor.

6 Claims, 8 Drawing Sheets

U.S. PATENT DOCUMENTS

| | | |
|---|---|---|
| 6,794,599 B2 | 9/2004 | Kajiura et al. |
| 2006/0042545 A1 | 3/2006 | Shibata et al. |

FOREIGN PATENT DOCUMENTS

| | | |
|---|---|---|
| EP | 0324294 | 7/1989 |
| JP | 2007-009309 A | 1/2007 |
| WO | 03/102397 A1 | 12/2003 |
| WO | 2005/004556 A2 | 1/2005 |
| WO | 2005009932 | 2/2005 |
| WO | 2007/043783 A1 | 4/2007 |

OTHER PUBLICATIONS

Stratton, P. F.; Bruce, S.; Cheetham, V.: Low-pressure carburizing systems: A review of current technology, BHM Berg-und Hüttenmännische Monatshefte vol. 151, Issue: 11 (2006), pp. 451-456.*

* cited by examiner

FURNACE ATMOSPHERE ACTIVATION METHOD AND APPARATUS

CROSS REFERENCE TO RELATED APPLICATION(S)

This application claims the benefit of U.S. Provisional Application Ser. No. 60/928,385, filed on May 9, 2007, which is incorporated by reference as if fully set forth.

BACKGROUND

The present invention concerns elevated temperature, thermal treatments of metallic or cermet materials and work parts in furnaces or reactors using reactive atmospheres. The atmospheres and treatments in the scope of invention include carburizing, nitriding, carbonitriding, nitrocarburizing, boronizing, bright annealing or oxide reduction, reducing atmospheres for brazing, soldering and sintering, carbon potential atmospheres for neutral heat treating of phase transformation alloys, solutionizing, aging, spheroidizing, hardening, stress relieving, normalizing, inert annealing, and the like. The components of said atmospheres may include nitrogen ($N_2$), hydrogen ($H_2$), hydrocarbon gases (HC) such as methane ($CH_4$), acetylene ($C_2H_2$), ethylene ($C_2H_4$), propane ($C_3H_8$) and many heavier molecular weight hydrocarbons, ammonia ($NH_3$), evaporated alcohols such as methanol ($CH_3OH$) or ethanol ($C_2H_5OH$), carbon monoxide (CO), carbon dioxide ($CO_2$), water vapor ($H_2O$), and noble gases such as argon (Ar) and helium (He). Additional components of the atmosphere may include reaction byproducts and gases evolving from the furnace load or walls and/or heating components as well as the gases leaking into the furnace from outside, e.g. air. Atmosphere gases may be introduced into the furnace as blends, premixed up-stream of the furnace in the gas flow control system, or can mix inside the furnace chamber. The other options for atmosphere gas supply may include streams produced by endothermic and exothermic generators, e.g. the endothermic blend of 20% CO, 40% $H_2$ and 40% $N_2$ (unless otherwise stated, all percentages identified in this application should be understood to be on a volume basis) made by reforming $CH_4$ with air, dissociated $NH_3$, or injection and evaporation of liquids, e.g. $CH_3OH$. There are three common process control problems when using atmospheres in elevated temperature thermal treatments: (1) slow kinetic reactions or stability of gas injected, (2) surface condition of material of work part loaded to furnace, and (3) environmental air leakage. For example, $CH_4$ injected into the furnace for carburizing may slowly react with and dispose of undesired oxygen ($O_2$) or $CO_2$ and/or may shift the thermodynamic potential of furnace atmosphere, and/or may dissociate and react only marginally, unless furnace temperature is very high; however, the high temperature poses a risk of damaging the loaded metallic material or work part. Similar situations take place to a larger or smaller degree with $H_2$, $NH_3$, and the other HCs. Also, the material or work surface loaded into the furnace may be covered with a thick film of oxide, rust, or water-based oily residues, and the reactivity of the original atmosphere may turn out to be insufficient for this film removal within the desired treatment time and temperature range. Finally, furnace air leaks and the other $O_2$-containing sources of contamination may require additions of reducing and, sometimes, carburizing gases to the atmosphere, even if the most desired atmosphere would be an inert environment to parts for specific thermal transformation processes, that is, one without reducing and/or carburizing gases. Such in-situ geftering techniques are limited by many process considerations. For example, the amount of $H_2$ added to $N_2$ atmosphere for reflowing solders on printed circuit boards has to be kept below 5% for safety, i.e. elimination of explosion risk in open or semi-open reflowing ovens, and the temperature has to be kept low, typically below 250° C., to prevent board and component damage. With these low temperatures and concentrations, the gettering and oxide removal effect of $H_2$ is marginal due to slow reduction kinetics. Similar limitations can be found in carburizing of steel parts with natural gas, in the absence of endothermic, CO-containing atmospheres. For example, $CH_4$ dissociates thermally and reacts with a steel surface at rapid, industrially attractive rates only above 1000° C., but many of the steels treated reveal an undesired grain growth effect at such high temperatures.

A number of ways have been used to deal with the problems described. Vacuum furnaces are used for thermal treatments to avoid environmental air leakage and evaporate impurity condensates from materials or parts loaded. Unfortunately, all vacuum furnace systems are expensive from the capital and operating standpoint. Moreover, the use of vacuum furnace doesn't solve the problem of gas stability. Thus, in the case of carburizing, more expensive and less stable hydrocarbons (HCs) have to be used, e.g. $C_2H_2$, and the use of the lowest cost $CH_4$ is very limited. Ion plasma vacuum furnaces have been developed to cope with the problem of gas stability and the surface films initially covering loaded work parts, but the cost of those systems, issues with processing complex part geometries and the difficulty of controlling the temperature, limit the use of ion plasma systems. The additional complication with these and similar electric discharge methods, e.g. corona, direct arc or plasma transferred arc, is the requirement of making the work part (to be treated) one of the electrodes closing the discharge circuit. The furnace or reaction vessel becomes more complex and, in the case of intricate or electronic work parts, the current may damage the work parts. Non-transferred arc thermal plasma systems capable of operating at atmospheric pressures have been explored as gas-activating injectors that do not need to close the electric circuit via the work part. Nevertheless, the high temperature and current required in these systems shortens the life of electrodes to 100 hours or less and results in furnace contamination. The newest generation of microwave furnace systems eliminates the need for vacuum or low-pressure chamber and frequent electrode changes while activating the surface of loaded materials or work parts. Nevertheless, industrial-scale microwave furnace systems are complex, expensive and not as flexible in accepting diverse metallic materials and geometries of work parts as the traditional, thermally heated furnaces.

Drissen at al. (U.S. Pat. No. 5,717,186) proposed additional measures for controlling the direct current flowing through a workpiece in an ionic, vacuum heat treatment furnace. Law et al. (U.S. Pat. No. 5,059,757) devised a way of limiting sooting in the same type of furnace. Orita (U.S. Pat. No. 5,605,580) used a multi-step heat treatment procedure to minimize a non-uniform edge-carburizing effect, much more acute in the vacuum plasma systems than in the conventional gas carburizing. Georges (U.S. Pat. No. 5,989,363) demonstrated the need for radiation screens in post-discharge, vacuum plasma nitriding. Giacobbe (European Patent No. 0324294A1) described workpiece surface and through hardening using a water-cooled thermal plasma torch. He and Paganessi (PCT Publication No. WO2005/009932A1) also used a high-power (50-500 kW) plasma reactor to generate treatment gases that were, subsequently, injected into a vacuum furnace. Czernichowski (U.S. Pat. No. 6,007,742) disclosed a series of experimental, normal atmosphere pressure, "GlidArc" plasma methods for reforming natural gas and other hydrocarbons. Hundreds of research papers exist concerning the use of more or less elaborate, typically low-pressure, laboratory-scale plasma systems for metal treatment in the heat treating applications as well as modification of gas stream composition. Nevertheless, a large portion of the metal heat treating industry and thermal process operators continue to look for an improved, reactive atmosphere system could enhance kinetics of reactions in gas phase and at work surfaces while, simultaneously, may be retrofitted to the existing, normal or reduced pressure furnaces or reactors, and would not necessitate high capital or operating and maintenance expenses.

BRIEF DESCRIPTION OF THE DRAWING(S)

The following detailed description of the preferred embodiments of the invention will be better understood when read in conjunction with the appended drawings. For purposes of illustrating the invention, drawings depict the embodiments which are presently preferred. It is understood, however, that the invention is not limited to the precise arrangements and instrumentality shown in the drawings.

SUMMARY OF THE INVENTION

In one respect, the invention comprises an activated gas injector for use with a controlled atmosphere reactor having a reactor chamber. The activated gas injector includes a shell that defines an activation chamber having an outlet, a first gas inlet which is adapted to be connected to a supply of a first gas and to introduce the first gas into the activation chamber, a first electrode that extends into the activation chamber and terminates within the activation chamber, a power supply connected to the first electrode which, when energized, provides an average voltage output at least 1 kV and an average current output of less than 10 A, and a second electrode that is exposed to the activation chamber and provides a ground potential with respect to the first electrode. The first and second electrodes are positioned so that electrical discharges occur between the first electrode and the second electrode when the power supply is energized, the area in which the electrical discharges occur defining an electrical discharge zone. The activation chamber, the first electrode, the second electrode, and the first gas inlet are configured so that the first gas is drawn through the electrical discharge zone before exiting the activation chamber through the outlet.

In another respect, the invention comprises, a controlled-atmosphere reactor system including a reactor chamber adapted to accommodate a workload to be treated, the reactor chamber having an exhaust, at least one heat source being collectively capable of elevating the reactor chamber to a temperature of at least 90 degrees C., and at least one gas injector. Each of the gas injectors include a shell defining an activation chamber having an outlet that is in flow communication with the reactor chamber, a first gas inlet which is adapted to be connected to a supply of a first gas and is positioned to introduce the first gas into the activation chamber, a first electrode that extends into the activation chamber and terminates within the activation chamber, a power supply connected to the first electrode which, when energized, provides an average voltage output at least 1 kV and an average current output of less than 10 A, and a second electrode that is exposed to the activation chamber and provides a ground potential with respect to the first electrode. The first and second electrodes are positioned so that electrical discharges occur between the first electrode and the second electrode when the power supply is energized, the area in which the electrical discharges occur defining an electrical discharge zone. The activation chamber, the first electrode, the second electrode, and the first gas inlet are configured so that the first gas is drawn through the electrical discharge zone before exiting the activation chamber through the outlet.

In yet another respect, the invention comprises a method for activating an atmosphere contained by a reactor chamber of a controlled-atmosphere reactor. In accordance with the method, a first gas is supplied into an activation chamber from an elevated pressure source. Electrical discharges are generated between a first electrode located within the activation chamber and a second electrode having a ground potential with respect to the first electrode by connecting the first electrode to a power supply that provides an average output voltage of at least 1 kV and an average output current that is less than 10 A. The first gas is exposed to the electrical discharges and is discharged into the reactor chamber through an outlet formed in the activation chamber. A pressure of no less than one millibar is maintained in the reactor chamber while the first gas is being discharged into the controlled-atmosphere reactor chamber. A temperature of at least 90 degrees is maintained in the reactor chamber while the first gas is being discharged into the reactor chamber.

DETAILED DESCRIPTION OF THE PREFERRED EMBODIMENT(S)

The invention, detailed below, comprises an electric discharge apparatus and a method of using the apparatus in a conventional furnace for heat, thermochemical, or surface treating of metals or metal-containing components. The conventional furnace may be any type of a controlled atmosphere heat treating furnace: a batch-type, box or bell furnace, or a continuous belt, pusher or roller hearth furnace, operating at an approximately atmospheric pressure, or a so-called vacuum furnace, operating at a reduced pressure which is not lower than 1 millibar at the time of using the apparatus. In each instance, the conventional furnace requires its own heating elements and temperature control system. The apparatus and method can be applied to any type of atmosphere and furnace operation defined in the background of invention.

Figure 1:
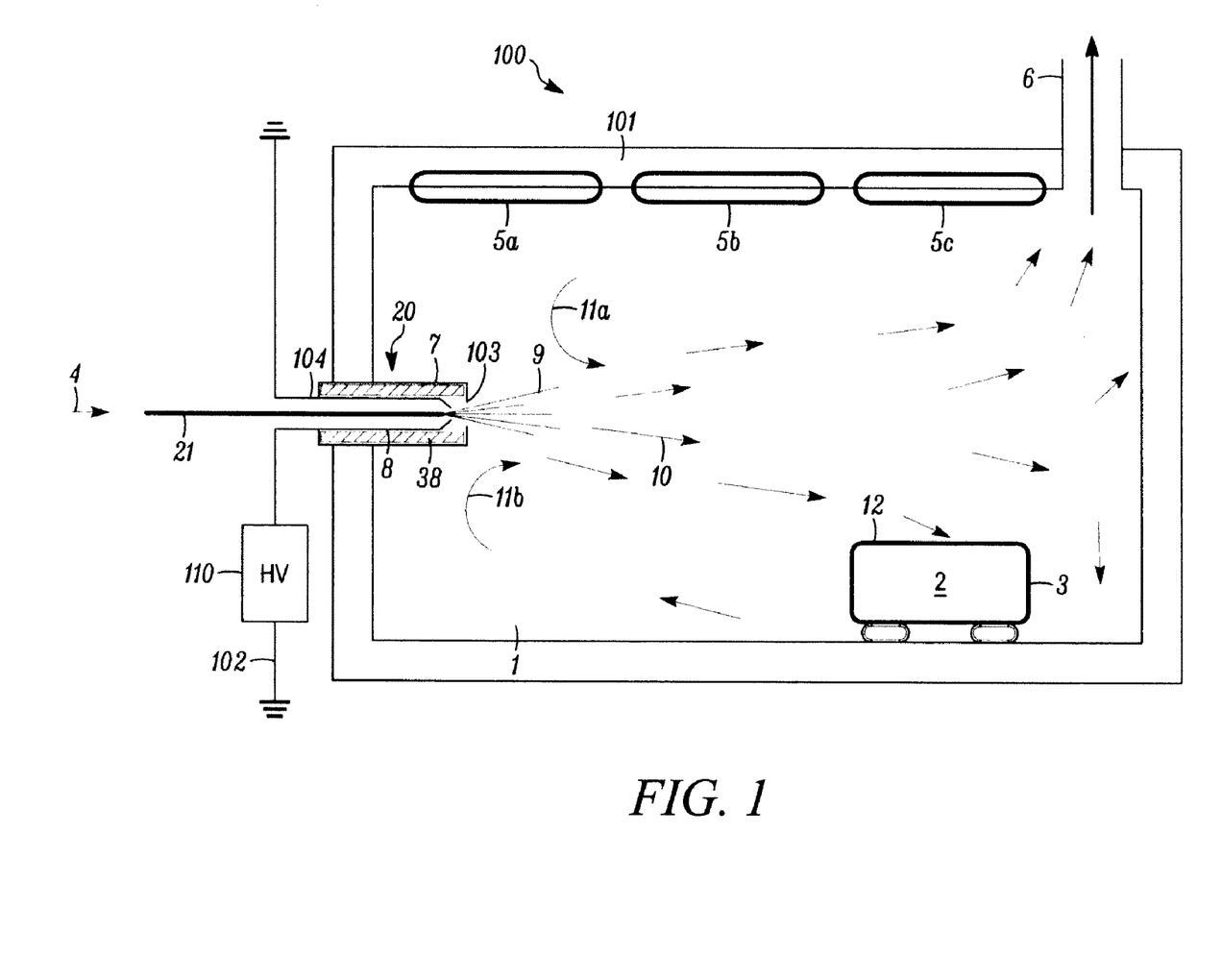
FIG. 1 is schematic sectional view of a heat treating furnace including an activated gas injector in accordance with the present invention.

Referring to FIG. 1, one embodiment of the present invention is shown schematically. This embodiment comprises a heat treating furnace 100, having a furnace wall 101, which defines a furnace chamber 1, in which a workload 2 is positioned. The furnace also includes a plurality of heaters 5a, 5b, 5c, an exhaust 6 and, in accordance with the present invention, an activated gas injector 20.

The activated gas injector 20 comprises an injector shell 7 which extends into the furnace chamber 1 and terminates at an outlet 103. In this embodiment, the injector shell 7 is a generally cylindrical pipe. A gas supply pipe 21 extends into the injector shell 7 and terminates inside the injector shell 7 before reaching the outlet 103. The activated gas injector 20 also includes electrodes 8, 104 which extend into the injector shell 7 and terminate inside the outlet 103, and are preferably positioned between the outlet end of the supply pipe 21 and the outlet 103. Electrode 104, injector shell 7, supply pipe 21 and furnace wall 101 are all preferably grounded (which results in a ground potential relative to the electrode 8 when electrode 8 is energized, in the manner described herein). Electrode 8 is connected to a high-voltage power supply 110 and is insulated from electrode 104, injector shell 7, supply pipe 21 and furnace wall 101 with an insulator 38. The insulator 38 preferably is made of a ceramic oxide material, without organic additives, can be used for the electric insulation. Examples include alumina, silicates, mica, magnesia, or glass. Any type of a high-voltage, low-current power supply 110 could be used. For example, alternating current (AC) power supply having an input voltage of 110V to 230V, an average output voltage in the range of 1 kV to 50 kV (both at a frequency of approximately 50 Hz to 60 Hz) could be used. Alternatively, a direct current (DC) power supply having an input voltage of 12V to 230V, an average output voltage in the range of 1 kV to 50 kV could be used. If a DC power supply is used, it preferably includes a half-wave or full-wave rectifier. In both cases, it is preferable that the average operating current for the power supply 110 be no more than 10 A and, more preferably, no more than 5 A. Notably, the present invention can be implemented using a simple, low-cost AC or DC power supply. A high-frequency, high-voltage power supply (also called a "pulse" or "pulsed" power suppy) is not required.

Use of a high-voltage, low-current power supply to activate the process gas enables the activated gas injector 20 to operate at high reactor chamber temperatures without the use of a fluid-based (e.g., water) cooling system and provides for a longer service life than if a high-current power supply was used. Use of low current will reduce the likelihood of damaging or melting electrode surfaces. Use of high-voltage assures large, voluminous discharges within the process gas stream, even at a low current. It is preferable that the injector shell 7 protrudes into the furnace chamber 1 so that the electrodes 8, 104 can absorb heat from the furnace chamber 1. Alternatively, the injector shell 7 could be mounted so that the outlet 103 is flush with the furnace wall 101. The injector shell 7 comprises an internal volume (referred to herein as an activation chamber) in which a process gas is activated before being discharged into the furnace chamber 1.

When the "hot" electrode 8 is energized by the power supply 110, electrical discharges form between the "hot" electrode 8 and the grounded electrode 104 (and perhaps injector shell 7). In an embodiment in which a separate grounded electrode 104 is not provided, the electrical discharges would form between the "hot" electrode 8 and the injector shell 7. The process gas stream 4 flows through the supply pipe 21 and then passes through the electrical discharge, resulting in an electric discharge activated stream 9, which is directed into the furnace chamber 1. The electric discharge activated stream 9, then expands into the furnace interior as shown by the arrows 10. It is preferable that the electrodes 104, 8 be positioned so that, when the when the power supply is energized, an electrical field having a strength of between 1 kV/cm and 100 kV/cm is formed between the electrodes 104, 8.

Under most operating conditions, a portion of the expanded stream 10 recirculates inside the furnace chamber 1 and may come in contact with the surface 12 of the work load 2 before exiting furnace chamber 1 via exhaust 6, along with the other gases present in the furnace chamber 1. As the electric discharge activated stream 9 expands into the furnace chamber 1, it may aspirate and entrain a portion of the volume of gas atmosphere already present in the chamber. This aspiration entrainment effect, illustrated in FIG. 1 by arrows 11a, 11b, results in the chemical interaction between the electric discharge activated stream 9 and the rest of the furnace atmosphere. Thus, the introduction of the electric discharge-activated stream 9 has two effects on the furnace atmosphere: (1) the electric discharge-activated stream 9 is added to the furnace atmosphere and (2) a secondary interaction occurs between the electric discharge-activated stream 9 and the existing gases in the furnace atmosphere. The secondary interaction requires gas to be present inside the furnace chamber 1 prior to the introduction of the electric discharge-activated stream 9. Therefore, the secondary interaction will not take place in a "hard-vacuum" furnace chamber, having a pressure below 1 millibar (mbar) during the atmosphere activation process. In addition, the present invention does not rely on a direct impingement of activated gas species at the surface 12 of the work load 2 and it does not require the work load 2 to be part of the circuit that results in the electrical discharge (i.e., no electrical charge is applied to the work load 2). Thus, the present invention provides an improved alternative to plasma ion-nitriding and ion-carburizing furnaces, which operate at reduced pressures and require an electrical connection to all loaded workpieces.

The activated gas injector 20 (more specifically, the activation chamber) is adapted to operate at substantially the same temperature as the operating temperature of the furnace chamber 1. The activated gas injector 20 may operate at a slightly lower temperature than the operating temperature of the furnace chamber 1 if the process gas is supplied at a lower temperature than the operating temperature of the furnace chamber 1 and/or if a portion of the activation chamber is located outside of the furnace chamber 1. The activated gas injector of the present invention could be incorporated into many alternative types of controlled-atmosphere reactor systems and reactor chamber configurations. In continuous reactor chamber applications (i.e., a reactor chamber having a loading end and an unloading end), it is preferable to position one or more activated gas injectors proximal to the loading end and one or more activated gas injectors proximal to the unloading end.

The following is an example of a specific implementation of the present invention. It is not uncommon for an endothermic, carburizing furnace atmosphere with the nominal composition of 20% CO, 40% H2 and 40% N2 to accumulate an excessive amount of detrimental CO2 because of carburizing reactions, reduction of oxide scale on the workload, or air ingress into the furnace. The injection of a HC gas, such as CH4, can be used to remediate the excess CO2 via the following chemical reaction: $CH_4+CO_2=2CO+2H_2$. Unfortunately, this reaction requires thermal-activation and, even with thermal activation is slow.

If, in accordance with the present invention, CH4 gas is injected into the furnace chamber across an electric discharge and/or plasma (hereinafter referred to as "electrical activation"), a portion of the gas stream would be converted into ions, atoms, radicals, and excited molecules, such as H, H*, $H^+$, $H_2^*$, $H_3^*$, $C_2$, CH, $CH_2$, $CH_3$, $CH_3^+$, etc. Clustering reactions in the discharge may also produce, in-situ, different types of hydrocarbons such as $C_2$-based reactive acetylene, C2H2, or ethylene, C2H4. Most, if not all of these products, injected into the furnace atmosphere, react with the undesired CO2 much more completely and more quickly than conventional, thermal-only activation of CH4.

The present invention can be used to inject an atmosphere-modifying gas and/or an atmosphere-forming gas into the furnace. An atmosphere-modifying gas is one in which at least a fraction of the gas stream is converted into ions, atoms, radicals, and excited molecules, such as H, H*, H*, $H_2^*$, $H_3^*$, $C_2$, CH, $CH_2$, $CH_3$, $CH_3^*$, etc. An atmosphere-forming gas is one in which the composition of the feed gas changes, that is, new molecules are formed due to the energy provided by the injector.

Five additional embodiments of the present invention are shown in FIGS. 2A through 3C& 2B. In each successive embodiment, features shown in the drawings that correspond to features shown in FIG. 1 are designated by reference numerals that are increased by a factor of 100. For example, the activated gas injector 20 is designated by reference numerals 120 and 220 in the second and third embodiments, respectively. Some of the corresponding features are numbered in FIGS. 2A through 3C to provide context but are not specifically referred to in the description of the additional embodiments.

Figure 2A:
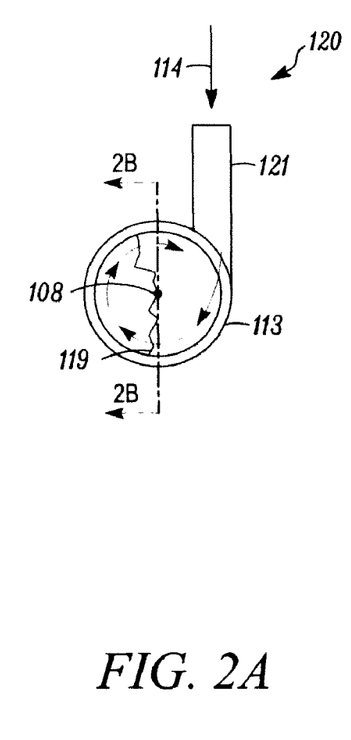
FIG. 2A is a front view of an alternate embodiment of an activated gas injector having an open outlet end.
Figure 2B:
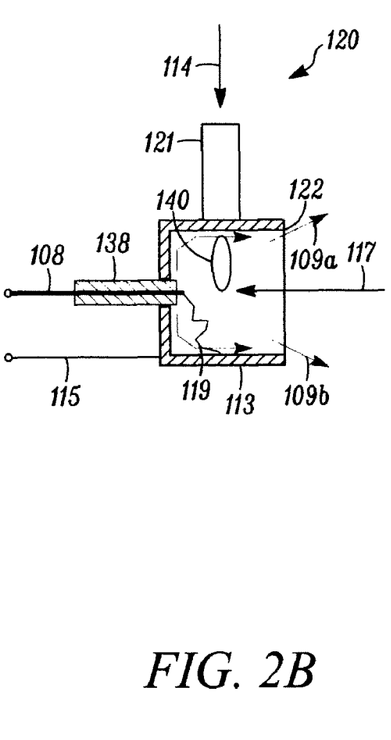
FIG. 2B is a sectional view taken along line 2B-2B of FIG. 2A.

FIGS. 2A & 2B show a second embodiment of an activated gas injector 120 which includes a cylindrical cup 113 having an open end 122, a supply pipe 121 and an electrode 108. The internal volume defined by the cup 113 and the open end 122 is the activation chamber for this embodiment. Like the electrode 8 shown in FIG. 1, the electrode 108 is preferably connected to a high-voltage, low-current power supply (not shown). The electrode 108 extends into the cup 113 along its central axis, terminates inside the cup 113 (i.e., does not extend past the open end 122 of the cup 113) and is insulated from the cup 113, preferably by a ceramic, high-temperature-resistant insulator 138. The cup 113 is preferably made from a conductive metal and is grounded by a ground lead 115.

When operated, a process gas stream 114 is injected into the cup 113 from an external source via an inlet 140 from a gas supply pipe 121. The gas supply pipe 121 and the inlet 140 is preferably positioned tangent to the perimeter of the cup 113. After entering the cup 113, the process gas swirls inside the cup 113, is exposed to electric discharges 119, and exits the cup 113 along the lines shown by arrows 109a, 109b. Due to the nature of the vortex flow formed inside the open-ended and short cup 113, a low-pressure region is formed in the central zone of the cup 113, which draws in and aspirates furnace atmospheric gases (shown by arrow 117). The aspirated stream 117 mixes with the swirling process gas stream 114 and exits along the lines 118a, 118b.

In this embodiment, electric discharges 119 extend between the electrode 108 and the cup 113 during the described vortex mixing process, which subjects both the process gas stream 114 and the aspirated (furnace atmosphere) stream 117 to electric discharge-activated reactions. The discharges 119 are formed by discrete arcs and/or streamers running between the tip of the hot electrode 108 and the internal diameter of the cup 113. The formation of a more uniform plasma glow around these arcs is also noted if the flowrate of the stream 14 is not excessive. It is preferable that the flow rate of the process gas be within a range that results in a relatively uniform plasma glow around the electric discharges 119, which can be disrupted by an excessive process gas flow rate. The electric discharges 119 also tend to rotate around the inside of the cup 113 due to the vortex flow that is forced by the tangentially injected process gas stream 114. Rotation of the electric discharges 119 assures that there is no single-point arc-roots attachment on the surface of the cup 113, which reduces the possibility of thermal damage to the inner surface of the cup 113.

Figure 2C:
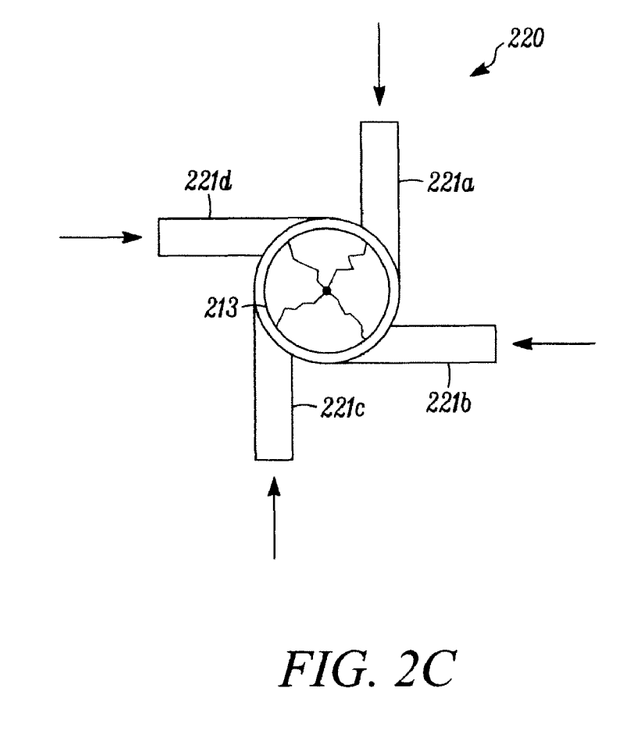
FIG. 2C is a front view of another alternate embodiment of an activated gas injector, which is similar to the activated gas injector shown in FIG. 2A, but includes multiple supply pipes.

FIG. 2C shows a third embodiment of the activated gas injector shown in FIGS. 2A & 2B. In this embodiment, the activated gas injector 220 includes multiple tangential injection ports 221a, 221b, 221c, 221d for the process gas, which may provide assuring a more uniform swirling inside the cup 213.

Figure 3A:
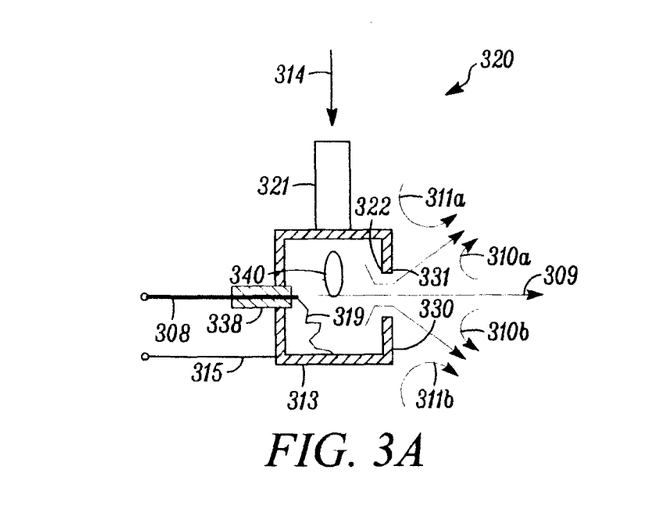
FIG. 3A is a sectional view of another alternate embodiment of an activated gas injector, which is similar to the activated gas injector shown in FIG. 2A, but includes a more restricted outlet end.
Figure 3B:
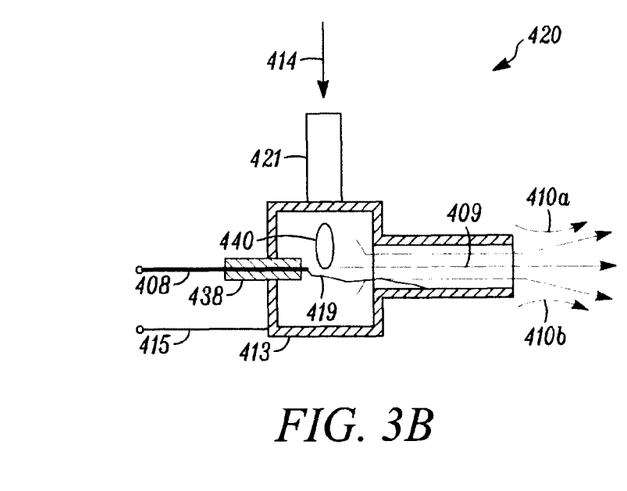
FIG. 3B is a sectional view of another alternate embodiment of an activated gas injector, which is similar to the activated gas injector shown in FIG. 3A, but includes an expansion tube on the outlet end.
Figure 3C:
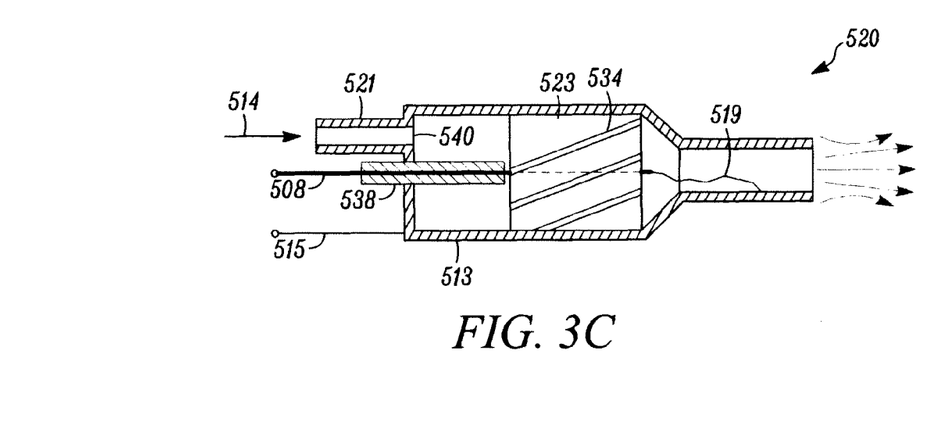
FIG. 3C is a sectional view of another alternative embodiment of an activated gas injector which includes an inline supply pipe and slanted slots cut into the injector shell.

FIGS. 3A, 3B and 3C show three additional embodiments of the activated gas injector. The activated gas injector 320 depicted in FIG. 3A is identical to activated gas injector 120 (shown in FIGS. 2A & 2B), except that the open end 322 of the injector cup 313 is partially-covered by a lid 330 having an axial hole 331 formed therein. As compared to the activated gas injector 120, the activated gas injector 320 reduces aspiration of furnace atmosphere gas into the injector cup 313 and increases the velocity of the electric discharge activated stream 309 as it exits the injector cup 313. As a result, increased aspiration and entrainment of the furnace gases with the electric discharge-activated stream 309 occur outside the cup. Thus, the aspirated furnace atmosphere 311a, 311b rapidly mixes with the electric discharge activated stream 309 to form new reacting streams 310a, 310b external to the injector cup 313.

The activated gas injector 420 injector depicted in FIG. 3B differs from the activated gas injector 320, shown in FIG. 3A, in that it includes an expansion tube 432 extending from the axial hole 431. The electric discharge-activated stream 409 moves faster along the axis of the expansion tube 432, which causes at least some of the electric discharges 419 to extend into the expansion tube 432. Thus, in this embodiment, the activation chamber includes the internal volume defined by both the cup 413 and the expansion tube 432. The visible, light-emitting portion of the electric discharges 419 may be easily beyond the expansion tube 432 (i.e., into the furnace chamber) by using higher process gas flow rates. Aspiration, entrainment and mixing of the electric discharge-activated stream 409 with the furnace atmosphere takes place externally, downstream of the expansion tube 432. As in the other embodiments, secondary reactions take place as aspirated gas from the furnace atmosphere (identified by reference numerals 410a, 410b in FIG. 3B) and the electric discharge-activated stream 409. The injection gas is fed to the activated gas injectors 320, 420 (FIGS. 3A and 3B) in same manner as the activated gas injector 120 shown in FIG. 2.

The activated gas injector 520 shown in FIG. 3C is similar to the activated gas injector 420, but includes an inline supply pipe 521 instead of the tangentially-positioned supply pipe 421. In order to generate rotational movement of the process gas, a swirl plate 523 is provided inside the injection cup 513, just upstream from the tip of the hot electrode 508. The swirl plate 523 is preferably made of a high-temperature dielectric ceramic and comprises a series of slanted or helical slots 534 formed thereon. The process gas stream 514 is forced through the slots 534, which causes the process gas stream 514 to swirl around the injector axis and forms a vortex flow.

In all of the embodiments discussed above, the injector shell and electrodes may be formed from any conductive, high-temperature corrosion resistant metals or alloys, such as stainless steel, Kovar, nickel alloys, tungsten, molybdenum, and their alloys, for example. The insulation used with the hot electrodes may be formed from any suitable dielectric and thermo-chemically resistant oxide ceramic, such as alumina, mullite, alumino-silicates, ceramic glass, or modified zirconia, for example.

Furthermore, multiple activated gas injectors could be used in a furnace at the same, depending on furnace size, configuration, and heat treatment or thermochemical surface treatment process requirements. Thus, in the case of open-ended, continuous furnaces, one or more activated gas injectors could be installed near the ends of the furnace, in order to prevent the penetration of the furnace interior with unreacted ambient air. Such a system would provide improved control and uniformity of the furnace atmosphere, as well as enhanced safety due to the elimination of potentially explosive gas blend pockets. Through testing of embodiments of the present invention, Applicants have observed, that the present combination of the high-voltage/low-current discharge characteristics and the secondary gas entrainment results in enhanced gas reactions and the furnace atmosphere modifications even if the total power supplied to the "hot" electrode is relatively low. In the case of injecting HC-gases according to the invented method, the amount of soot particles produced was also negligible. This contrasts with the conventional thermal plasma (arc) injection systems, i.e. "gas heaters," which are low-voltage/high-current devices, frequently demanding water cooling of anode, and cannot function inside hot furnaces at temperatures above 1050° C. (1922° F.), which are desirable for some metal treatment operations. Since hot gas molecules are easier to dissociate and activate in the electric discharge than the cold ones, the invented high-voltage/low-current apparatus and positioning the injector shell so that it absorbs heat from the furnace chamber 1 makes it possible to activate the atmosphere using much lower electric power than conventional thermal plasma (arc) injection systems.

As mentioned above in connection with power supply 110, the use of a low-current, high-voltage power source extends the life of injector electrodes. The low current arcs do not tend to melt electrode surfaces, and high voltage arcs assure large, voluminous discharges within the gas stream (even at low current levels). For the purposes of this invention, a "low-current, high-voltage" power source should be understood to be a power source having an average current output of less than 10 Amp and an average voltage output of at least 1.0 kV. While vortex stabilized, spinning plasma columns and reactors are known in the art, the invented unit differs from the prior art by aspirating hot furnace atmosphere gases into its core (e.g., the cup 113) through the electric discharge, mixing the aspirated hot furnace atmosphere gases with the fresh process gas stream, and exhausting the resultant mixture, once again through the electric discharge, all to maximize the gas-plasma interactions. The same comment can be made regarding chemically reactive, high-voltage/low-current/ high-frequency or pulsed electric discharges known in the art and called, collectively nonequilibrium or cold plasmas. Applicants observed, that the present combination of the high-voltage/low-current discharge characteristics, and the secondary gas entrainment, results in enhanced gas reactions and the furnace atmosphere modifications even if the total power of the discharge used, (P=Volt×Amp) is low.

A series of furnace atmosphere activation tests were run by Applicants using the activated gas injectors similar to those shown in FIGS. 2A through 3C. The experiments used process gas flow rates ranging from 10 scfh (0.28 m$^3$/hr) to 210 scfh (5.95 m$^3$/hr), and two distinctive types of high-voltage power supplies: (1) a DC-plasma unit operating at 0.5 A and between 2 kV to 10 kV (the average voltage being approximately 2 kV, but increasing up to 10 kV when the electrical discharge is lost or the circuit is open), and (2) an AC-plasma or spark unit (using a conventional, 60 Hz AC, residential power grid) operating at approximately 10 kV voltage and 0.09 A. The shortest distance between the tip of the hot and the ground electrodes in the AC injector (spark injector) was set for 0.14 inches (0.355 cm) which resulted in a maximum electric field strength E, of 28 kV/cm. The shortest distance between the tip of the hot electrode (in this case the cathode) and the ground electrode (in this case the anode), in the DC injector was set for 0.218 inches (0.55 cm) which resulted in a maximum electric field strength E, of 4.5 kV/cm during steady state operation and increasing to 18 kV/cm in upset mode when the discharge produced was weak or lost. Assuming an approximate total energy input of about 1 kW for each type of injector, the molar energy added to the gas stream processed, excluding energy losses to the surroundings, was inversely proportional to the stream flowrate: 23.9 eV for the flowrate of 1 scfh (0.028 m$^3$/hr), 2.39 eV for the flowrate of 10 scfh (0.28 m$^3$/hr), 0.239 eV for the flowrate of 100 scfh (2.8 m$^3$/hr), and 0.12 eV for the flowrate of 200 scfh (5.7 m$^3$/hr). Thus, in the $1^{st}$ approximation, the higher process gas flow rates were expected to produce an equal number of activated gas species as the lower flow rates, but at a reduced volumetric concentration and with the preference for forming lower activation-energy products. During room temperature tests, a thermocouple, placed in front of injector exit, indicated that the average temperature of the activated stream about 0.25 inches (6.3 mm) downstream did not exceed 200° F. (93° C.), with only small variations due to the process gas stream flow rate used. The atmosphere activation experiments with the apparatus described were run by Applicants in a ceramic material lined, electrically heated, semi-production scale box furnace, and the product atmospheres were sampled from the furnace exhaust using an ARI Laser Gas Analyzer, LGA 2017, based on the Raman spectroscopy principles. Results are presented below.

Figure 4:
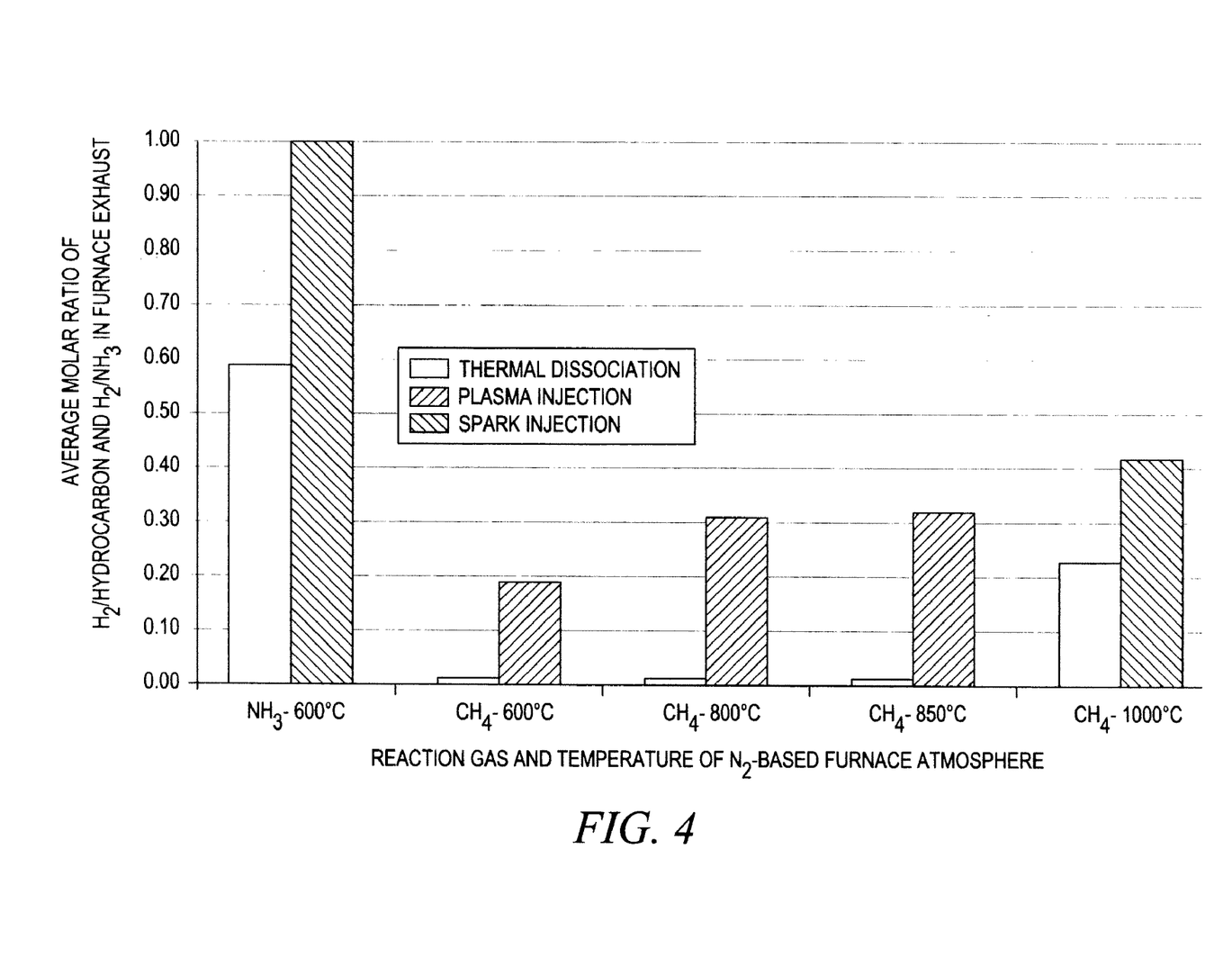
FIG. 4 is a bar graph showing the effects of NH3 and CH4 atmosphere activation at different temperatures and using different activation methods, including thermal activation, DC-plasma and AC-spark.

FIG. 4 shows the effects of atmosphere activation according to the invention by comparing the composition of the furnace gases using conventional, "thermal" dissociation of the process gas stream with furnace gas composition using the process gas activation methods of the present invention: DC-plasma, or "plasma", and AC-spark, or "spark." The evaluation involved injecting various N2-based blends of reactive gases, NH3 and CH4, into a furnace being kept at four different temperatures: 600° C. (1110° F.), 800° C. (1470° F.), 850° C. (1560° F.), and 1000° C. (1830° F.). The concentration of NH3 and CH4 in all blends was kept below the lower explosivity/flammability limit (LEL) which means that the blends could be released to ambient air without the risk of explosion or fire, i.e. can be used even in heat-treating furnaces that are not dedicated to the handling of flammable gases.

The first blend tested at 600° C. (1110° F.) comprised N2 and 2.5% NH3 as measured at the inlet to the furnace or to the electric discharge injector. The second blend was N2 and 3.4% CH4. The third blend consisted of N2 and 2.2% CH4. The first blend tested at 800° C. (1470° F.) consisted of N2 and 3.4% CH4, and the second consisted of N2 and 2.2% CH4. The blend tested at 850° C. (1560° F.) consisted of N2 and 2.4% CH4. The first blend tested at 1000° C. (1830° F.) consisted of N2 and 3.41% CH4 and the second consisted of N2 and 2.2% CH4. All tests were run in a ceramic lined furnace in order to avoid catalytic dissociation of the gases on furnace walls.

The evaluation was based on comparing the average molar ratio of H2/HC and H2/NH3 in the furnace exhaust for the thermal and the activated conditions, with the same process gas composition. Higher ratios (shown on the y-axis) indicate higher dissociation and reactions of the gas stream in the furnace atmosphere while lower ratios show the absence of such reactions and inert, undesired behavior. Although it is not clear to the Applicants which specific gas and electric discharge reactions were responsible for releasing H2 from the injected NH3 and CH4, the overall stoichiometry would suggest the use of the following normative reaction: m NH3→n NH3+0.5 (m−n) N2+1.5 (m−n) H2 with the H2/NH3 ratio plotted in FIG. 4 equal to 1.5 (m/n−1). The normative reaction for CH4 blends could be written in the similar way, except that the product hydrocarbon could not be specified by the gas analysis system used for these tests, and might differ from the originally injected CH4 by composition (probably lower H-content in the new HC molecule, e.g. C2H2) and offer an increased reactivity toward metallic surfaces. As FIG. 4 shows, injecting the process gas into the furnace atmosphere using DC and AC discharges results in an enhancement of the desired gas reactions, especially at operating temperatures below 1000° C. These operating temperatures are of the greatest interest in the metals processing industries.

Figure 5:
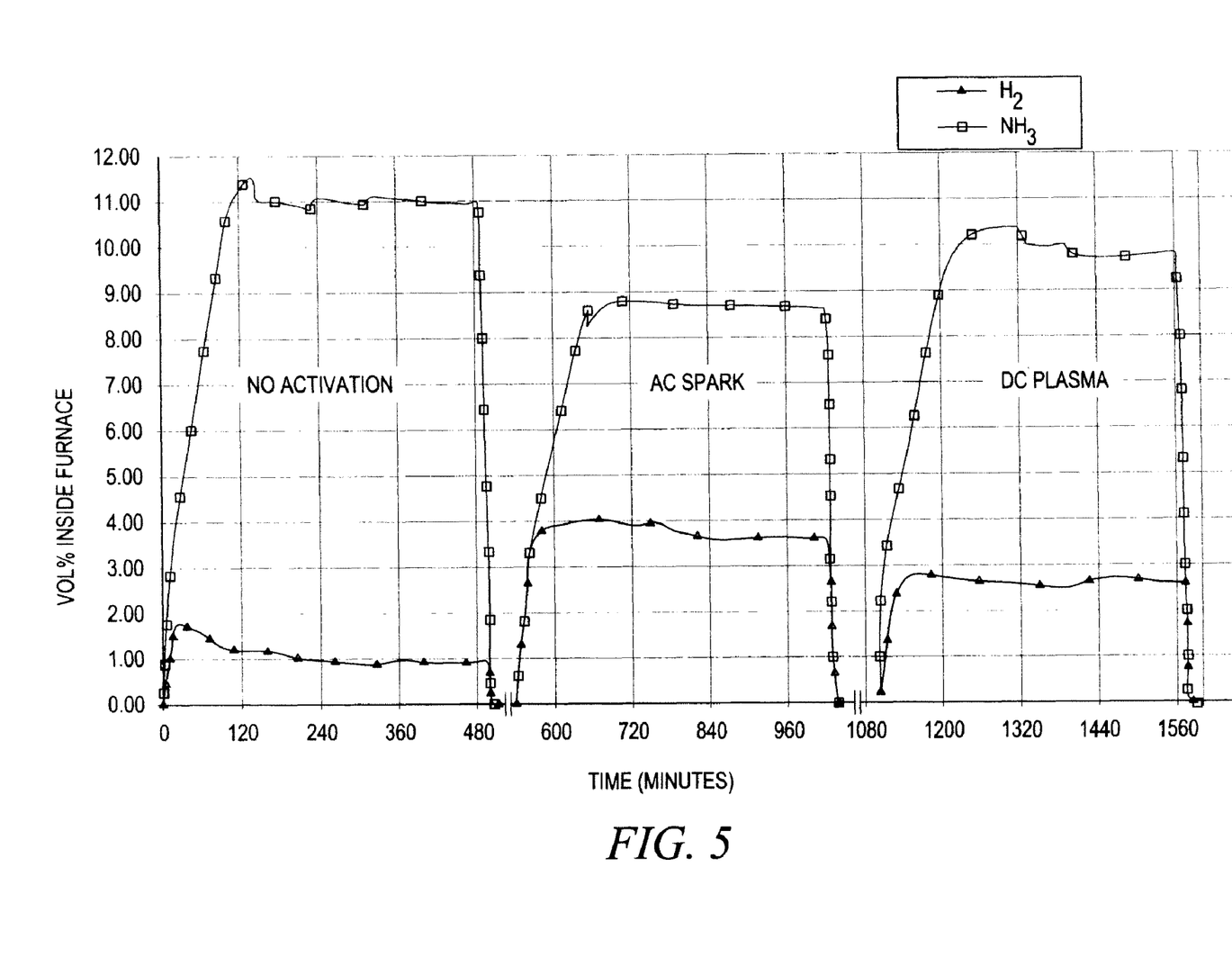
FIG. 5 is a graph showing the run-time concentrations of NH3 and H2 in activated furnace atmospheres, using thermal activation, DC-plasma and AC-spark.

FIG. 5 plots a run-time concentration of NH3 and H2 in the furnace atmosphere, sampled from the furnace exhaust, for experiments at 525° C. (975° F.) involving injection of the process gas stream comprising 12% NH3 in N2. The first test (labeled "no activation" in FIG. 5), where no electric discharge activation was used, shows the lowest drop in the NH3 concentration and the lowest concentration of H2 released from the decomposed NH3. The second test (labeled "AC spark" in FIG. 5), where AC spark injection was used, produced the strongest drop in the original NH3 concentration (from 12% to 8.8%) and the highest H2 gain (as high as 4%). The third test (labeled "DC plasma" in FIG. 5), in which DC plasma injection was used, produced NH3 and H2 concentrations falling between the concentrations for the first and second runs.

Figure 6:
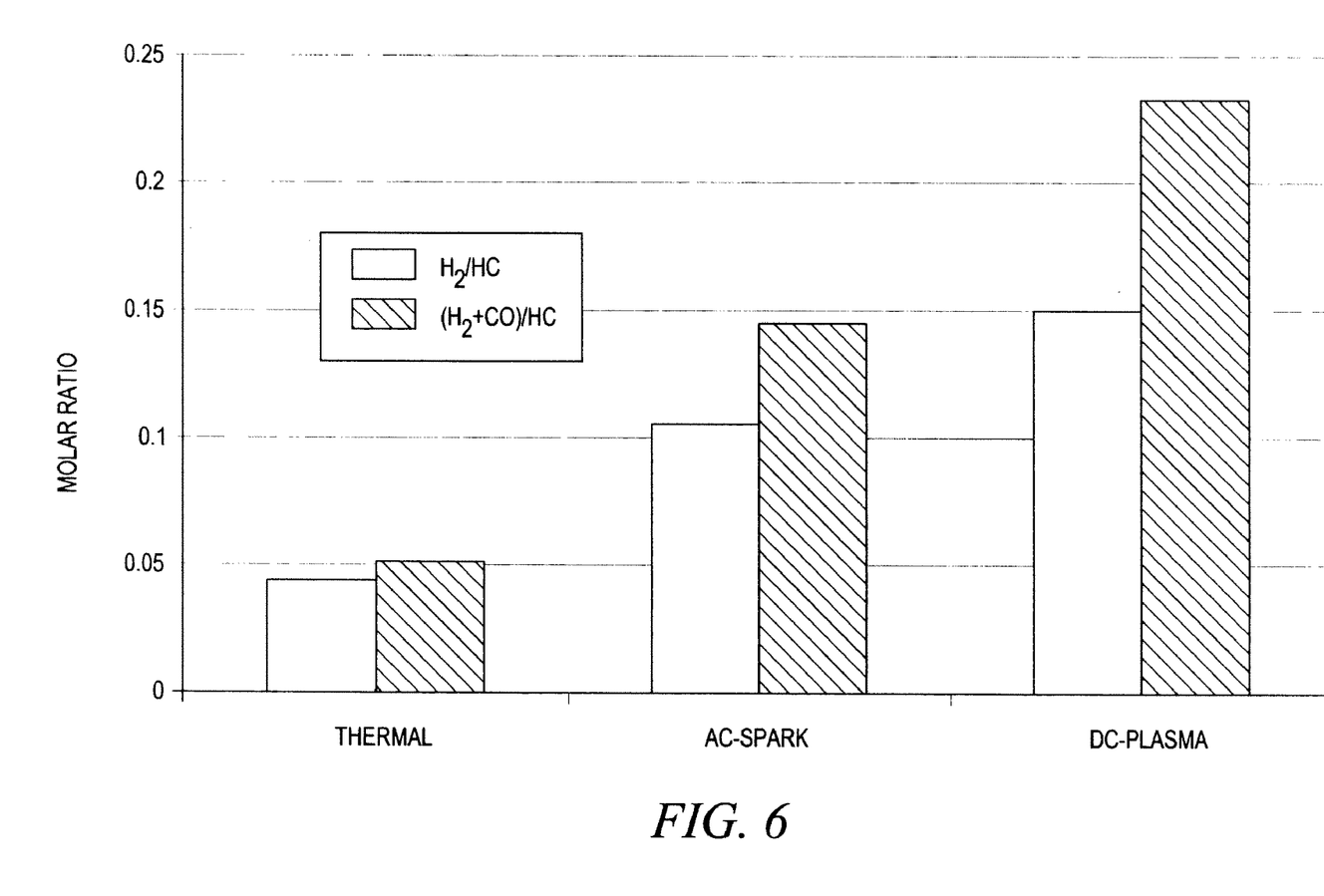
FIG. 6 is a bar graph showing the effects of O2-contaminated, C2H4 atmosphere activation using different activation methods, including thermal activation, DC-plasma and AC-spark.

FIG. 6 shows the effects of atmosphere activation using the same methodology as shown in FIG. 4, with two primary differences: (1) the HC diluted in N2 is C2H4 rather than CH4, and (2) a source of O2-contamination is added to the furnace in the form of heavily oxidized steel parts loaded therein. Since the reduction of iron oxides as well as carburizing of metallic iron produces CO2, and the desired but kinetically slow reaction of HC with this CO2 produces CO and H2, the evaluation of the atmosphere activation was based on the molar ratio of H2/HC as well as that of (H2+CO)/HC. As shown in FIG. 6, the DC-plasma injection system was the most effective at activating desired reactions inside the furnace, the AC-spark injection system was slightly less effective, and the conventional thermal activation system (i.e., no electric discharge activation) was the least effective.

Figure 7:
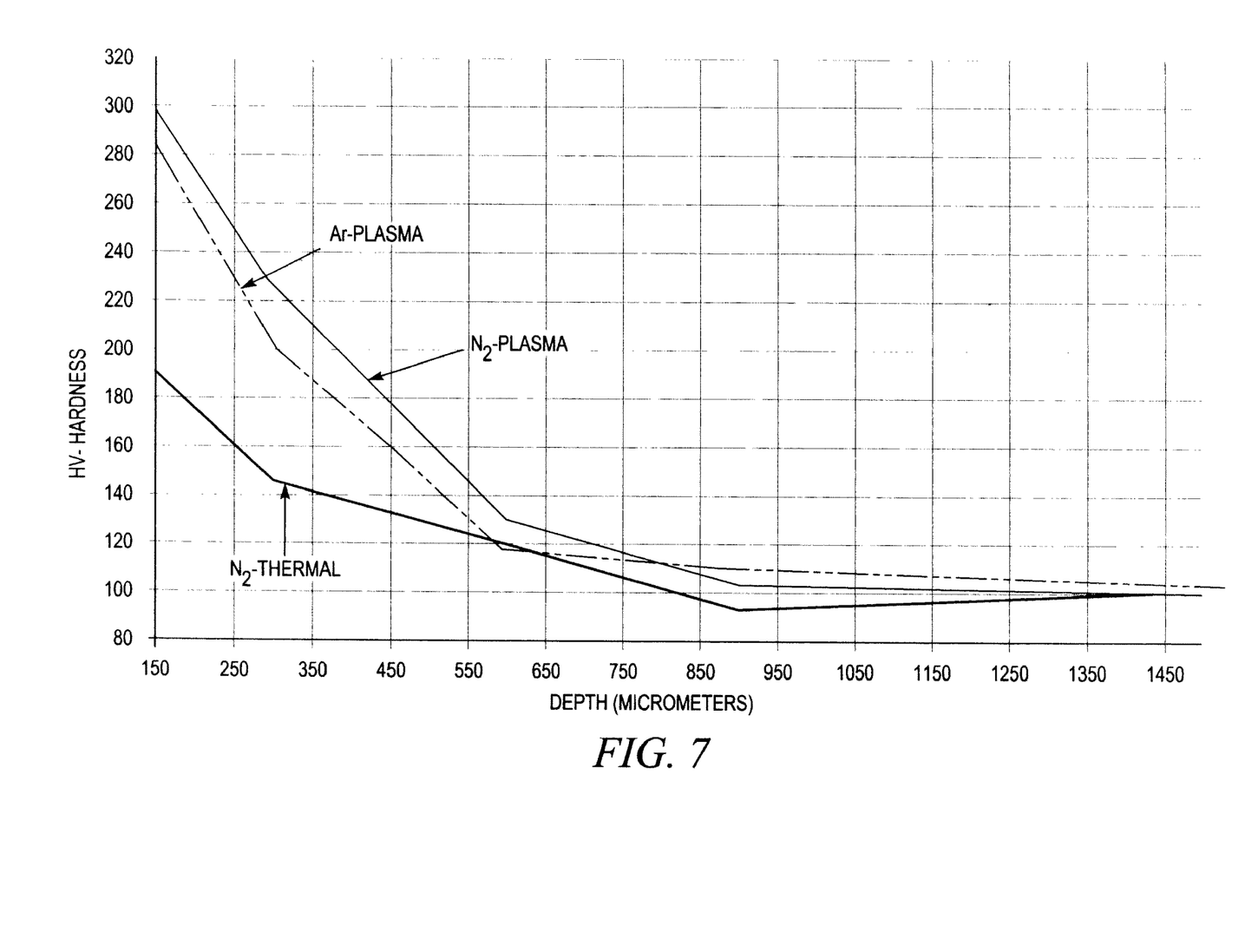
FIG. 7 is a graph showing the micro-hardness of activated carburizing tests of AISI-SAE 1010 steel parts using DC-plasma (with either Ar or N2 as the primary component of the injected gas) and thermal treatment (with N2 as the primary component of the injected gas)

FIG. 7 shows results of comparative case carburizing tests performed on AISI-SAE 1010 steel parts (having a 0.1% initial carbon level, by weight) using the conventional thermal activation method and the DC-plasma activation method of the present invention. The carburizing was run at 850° C. (1560° F.) for 3 hours using 2.5% CH4 diluted in N2 during the thermal and the first DC-plasma run, and 2.5% CH4 diluted in argon (Ar) in the second DC-plasma run. After the carburizing step, all samples were cooled to room temperature with the furnace without additional quenching and tempering operations. The results of carburizing were evaluated by profiling the microhardness (HV-hardness on Vickers scale) of the steel cross-sections as a function of depth (in micrometers) under the carburized steel surface. The highest surface and subsurface hardness indicating the highest degree of carburizing was found for the plasma activated N2-2.5% CH4 stream. The plasma activated Ar-2.5% CH4 stream produced very similar results. The surface hardness of the steel parts which were carburized using conventional thermal activation was significantly lower. Notably, these tests showed that N2 was slightly more effective than Ar (which is less reactive and more expensive than N2) when used as the primary gas in the injected process stream. This suggests that the primary reactions in electric discharge, the secondary gas reactions in the atmosphere, and reactions on steel surface are driven by the presence of activated, unstable gas species at least as much as the injection of nonreactive energy carriers.

Figure 8:
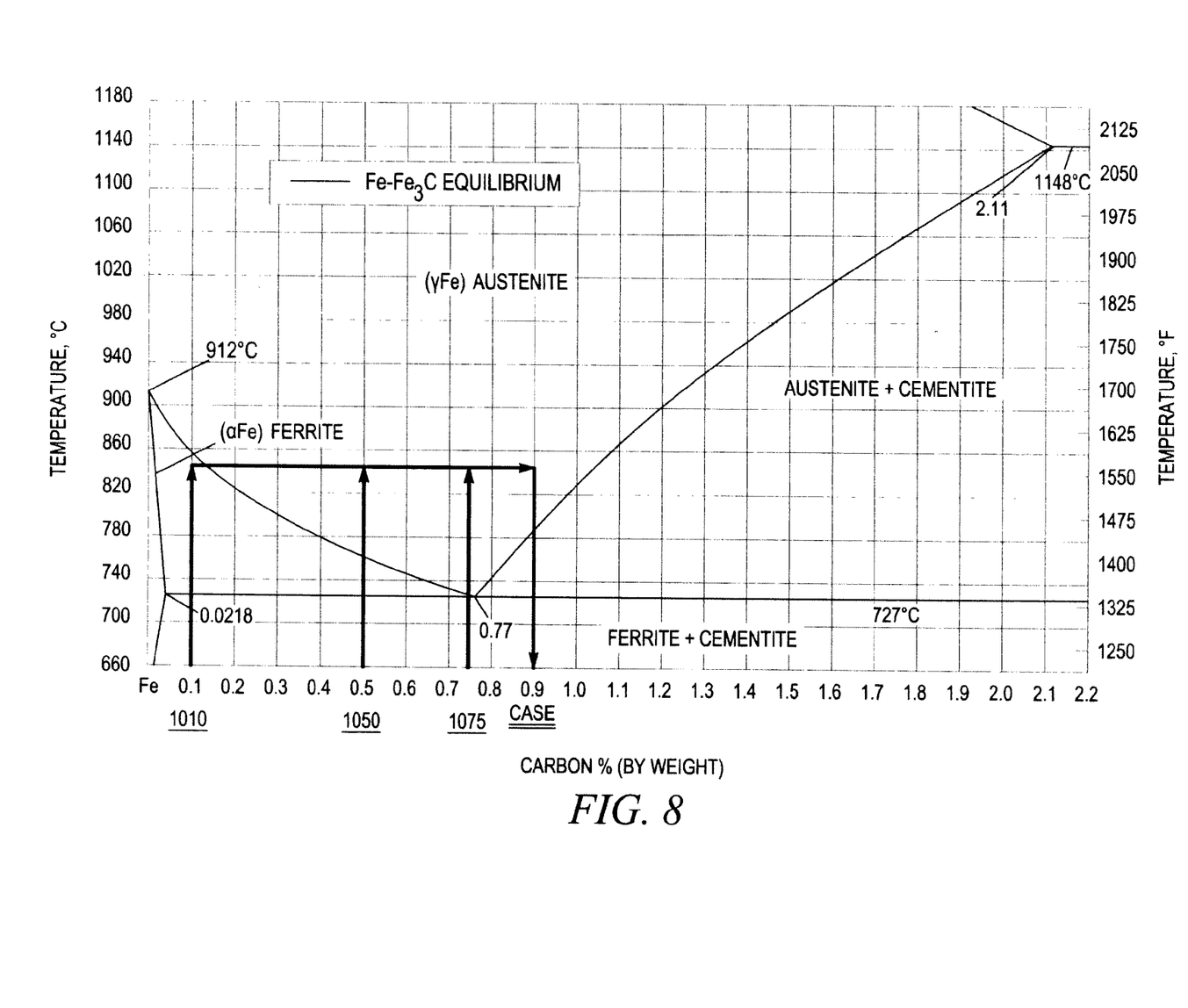
FIG. 8 is a summary of activated carburizing tests using DC-plasma.

FIG. 8 shows the results of the N2 plasma activated, carburizing test presented in FIG. 7, as well as additional carburizing tests run under the same conditions using the steel parts with an increased initial carbon level: 0.1% (by weight) for the AISI-SAE steel grade 1010 parts, 0.5% (by weight) for the AISI-SAE 1050 parts and 0.75% (by weight) for the AISI-SAE 1075 parts. In the graph shown in FIG. 8, temperature is shown on the Y-axis (degrees C. on the left and degrees F. on the right) and carbon content (% by weight) is shown on the X-axis. The results of the three tests are represented by the arrowed lines superimposed on the standard Fe—C binary phase diagram. The results show that surface carbon levels, marked in the FIG. 8 as "case" were increased to 0.9% (by weight) in mall three tests regardless of the starting carbon content, thus, determining the carburizing potential of the DC discharge-activated N2-2.5% CH4 atmosphere.

Additional tests were run with the purpose of accelerated bright annealing of surface oxidized steel parts using pure H2 atmospheres. Three types of hot mill-scaled test coupons were used: AISI-SAE 1010 carbon steel, A2 tool steel, and 304 austenitic stainless steel. The annealing tests were run at 1000° C. (1830° F.) for 2 hours using the H2 process stream flowrate of 90 scfh (2.55 m³/hr). One set of the three coupons was run under the conventional, thermal H2 atmosphere, while the other was run under the AC-spark injected and activated H2 atmosphere. The surface of the carbon steel was completely reduced and bright at the end of both tests. The surface of the tool steel was reduced and bright only for the AC-spark activated test and not for the conventional, thermal test. The surface of the stainless steel was not bright after any of the tests but the AC-spark test replaced the initial oxide film with a brownish film suggesting the presence of metal nitrides.

Table 1 lists some characteristics of some embodiments of the invention.

TABLE 1

| Utility | Boundary Conditions for Some Embodiments |
|---|---|
| activates all types of heat treating and thermochemical surface treating atmospheres including but not limited to carburizing, nitriding, and reducing compositions with N2, H2, HC, CO, NH3, endo-gas, alcohol-vapor and noble gas components | may not pyrolyze or completely dissociate gas molecules in the process stream |
| electric activation takes place in two steps: inside the discharge, where primary gas reactions take place, and downstream, in the entrained streams of the furnace atmosphere where the secondary reactions take place | may require the presence of the furnace atmosphere to enable the secondary reactions; the atmospheric pressure operation is preferred but a low-pressure operation (above 1 millibar) continues to be effective |
| requires no cooling during operation and gains in effectiveness with the amount of heat absorbed from the treatment furnace | metallic and ceramic materials of construction that resist high temperatures |
| high-voltage/low-current operation minimize wear of the electrodes while maximizing the chemical reactivity of gas species produced; the DC and low-frequency, 2-phase AC (which may be no more than 60 Hz) power units are compact and inexpensive | good quality ceramic dielectrics may be used in the injectors |
| apparatus and method can be retrofitted to any conventional furnace or reactor; may be also used to improve process control and safety in open-ended, continuous furnaces no current flows through the work load which is required for treating many electronic components, helps in simplifying furnace design and production operations, and prevents non-uniform treatment of work part edges and complex surface features | multiple injectors and more complex power supply units may be required in the case of large, elongated industrial heat treating lines the lack of the direct impingement of activated gas species characterizing the methods using work part as one electrode reduces the kinetics of anticipated surface reactions |

It is recognized by those skilled in the art that changes may be made to the above-described embodiments of the invention without departing from the broad inventive concepts thereof. It is understood, therefore, that this invention is not limited to the particular embodiments disclosed but is intended to cover all modifications which are within the full scope of the claims.

The invention claimed is:

1. A method for activating an atmosphere contained by a reactor chamber comprising an at least partially metallic work load of a controlled-atmosphere reactor, the method comprising:

supplying a first gas into an activation chamber from an elevated pressure source;

generating electrical discharges between a first electrode located within the activation chamber and a second electrode having a ground potential with respect to the first electrode by connecting the first electrode to a power supply that provides an average output voltage of at least 1 kV and an average output current that is less than 10 A;

exposing the first gas to the electrical discharges wherein at least a portion of the first gas forms an electrical discharge activated stream;

discharging the electrical discharge activated stream into the reactor chamber through an outlet formed in the activation chamber;

maintaining a pressure of no less than one millibar in the reactor chamber while the electrical discharge activated stream is being discharged into the controlled-atmosphere reactor chamber;

maintaining a temperature of at least 90 degrees Celsius in the reactor chamber while the electrical discharge activated stream is being discharged into the reactor chamber; and heat treating the at least partially metallic work load within the reaction chamber wherein the heat treating step is at least one selected from the group consisting of a carburizing, nitriding, carbonitriding, nitrocarburizing, boronizing, bright annealing, oxide reduction, brazing, soldering, sintering, neutral carbon potential annealing and inert annealing.

2. The method of claim 1, wherein:

introducing a first gas into an activation chamber comprises introducing a first gas into an activation chamber that is at least partially located within the reactor chamber.

3. The method of claim 1, further comprising:

aspirating at least a portion of the atmosphere into the activation chamber; and exposing the at least a portion of the atmosphere to the electrical discharge activated stream.

4. The method of claim 1, further comprising:

operating the activation chamber at substantially the same temperature as the reactor chamber.

5. The method of claim 1, further comprising maintaining a concentration of the first gas in the reactor chamber that is below the lower explosivity/flammability limit for the first gas.

6. The method of claim 1, wherein positioning the first and second electrodes so that, when the generating step is being performed, an electrical field is formed between the electrodes has a field strength between 1 kV/cm to 100 kV/cm.

* * * * *